United States Patent
Kirby et al.

(10) Patent No.: US 10,608,159 B2
(45) Date of Patent: *Mar. 31, 2020

(54) METHOD OF MAKING A SUPERCONDUCTOR DEVICE

(71) Applicants: Christopher F. Kirby, Gambrills, MD (US); Michael Rennie, Mechanicsville, VA (US); Daniel J. O'Donnell, Manassas, MD (US)

(72) Inventors: Christopher F. Kirby, Gambrills, MD (US); Michael Rennie, Mechanicsville, VA (US); Daniel J. O'Donnell, Manassas, MD (US)

(73) Assignee: NORTHROP GRUMMAN SYSTEMS CORPORATION, Falls Church, VA (US)

(*) Notice: Subject to any disclaimer, the term of this patent is extended or adjusted under 35 U.S.C. 154(b) by 483 days.

This patent is subject to a terminal disclaimer.

(21) Appl. No.: 15/351,755

(22) Filed: Nov. 15, 2016

(65) Prior Publication Data

US 2018/0138389 A1    May 17, 2018

(51) Int. Cl.
*H01L 39/24* (2006.01)
*H01L 39/02* (2006.01)
*H01L 39/12* (2006.01)

(52) U.S. Cl.
CPC ........ *H01L 39/2493* (2013.01); *H01L 39/025* (2013.01); *H01L 39/12* (2013.01); *H01L 39/2406* (2013.01)

(58) Field of Classification Search
CPC ... H01L 39/2493; H01L 39/025; H01L 39/12; H01L 39/2406
See application file for complete search history.

(56) References Cited

U.S. PATENT DOCUMENTS

| | | |
|---|---|---|
| 4,960,751 A | 10/1990 | Yamazaki |
| 5,055,158 A | 10/1991 | Gallagher et al. |

(Continued)

FOREIGN PATENT DOCUMENTS

| | | |
|---|---|---|
| EP | 1076110 A1 | 2/2001 |
| EP | 3387681 A1 | 10/2018 |

(Continued)

OTHER PUBLICATIONS

International Search Report corresponding to International Application No. PCT/US2017/058494, dated Feb. 12, 2018, pp. 1-17.

(Continued)

*Primary Examiner* — Paul A Wartalowicz
(74) *Attorney, Agent, or Firm* — Tarolli, Sundheim, Covell & Tummino LLP

(57) ABSTRACT

A method of forming a superconductor device structure is disclosed. The method comprises forming a base electrode in a first dielectric layer, forming a junction material stack over the base electrode, forming a hardmask over the junction material stack, etching away a portion of the junction material stack to form a Josephson junction (JJ) over the base electrode, and depositing a second dielectric layer over the hardmask, the JJ, the base electrode and the first dielectric layer. The method additionally comprises forming a first contact through the second dielectric layer to the base electrode to electrically couple the first contact to a first end of the JJ, and forming a second contact through the second dielectric layer and the hardmask to electrically coupled the second contact to a second end of the JJ.

20 Claims, 9 Drawing Sheets

(56) References Cited

U.S. PATENT DOCUMENTS

| | | | |
|---|---|---|---|
| 5,600,101 | A | 2/1997 | Sakai |
| 5,818,071 | A | 10/1998 | Loboda et al. |
| 6,184,477 | B1 | 2/2001 | Tanahashis |
| 6,280,201 | B1 | 8/2001 | Morris |
| 6,344,616 | B1 | 2/2002 | Yokokawa |
| 6,378,757 | B1 | 4/2002 | Holcombe |
| 6,482,656 | B1 | 11/2002 | Lopatin |
| 8,241,701 | B2 | 8/2012 | Dordi et al. |
| 8,951,808 | B2 | 2/2015 | Ladizinsky et al. |
| 9,653,398 | B1 | 5/2017 | Kelliher et al. |
| 9,780,285 | B1 * | 10/2017 | Kirby .................. H01L 39/223 |
| 2004/0155237 | A1 * | 8/2004 | Kerber ................ H01L 39/2493 257/31 |
| 2005/0239300 | A1 | 10/2005 | Yasumura et al. |
| 2006/0273446 | A1 | 12/2006 | Sato et al. |
| 2007/0059923 | A1 | 3/2007 | Lee et al. |
| 2007/0184656 | A1 | 8/2007 | Sherman et al. |
| 2008/0311711 | A1 | 12/2008 | Hampp et al. |
| 2009/0183984 | A1 | 7/2009 | Sakuma et al. |
| 2011/0241765 | A1 | 10/2011 | Pesetski et al. |
| 2018/0053689 | A1 | 2/2018 | Kirby et al. |

FOREIGN PATENT DOCUMENTS

| | | |
|---|---|---|
| JP | S6281075 A | 4/1987 |
| JP | S63205972 A | 8/1988 |
| JP | 64-064274 A | 12/1988 |
| JP | 2004232054 A | 8/2004 |
| JP | 2011164068 A | 8/2011 |
| JP | 2012519379 A | 8/2012 |
| JP | 2015511067 A | 4/2015 |
| KR | 1020010072404 B1 | 7/2001 |
| WO | 2003079429 A1 | 9/2003 |
| WO | 2017066553 A | 6/2017 |
| WO | 2018075117 A2 | 4/2018 |

OTHER PUBLICATIONS

Tolpygo, Sergey K., et al. "Process-Induced Variability of Nb/Al/ AlO$_x$/Nb Junctions in Superconductor Integrated Circuits and Protection Against It" *IEEE on applied superconductivity*, vol. 19, No. 3, Jun. 2009: 135-139.

Kerber, George L., et al. "Fabrication of high current density Nb integrated circuits using a self-aligned junction anodization process." *IEEE transactions on applied superconductivity* 13.2 (2003): 82-86.

Abelson, Lynn A., and George L. Kerber. "Superconductor integrated circuit fabrication technology." *Proceedings of the IEEE* 92.10 (2004): 1517-1533.

Canadian Office Action corresponding to Canadian Patent Application No. 3006284 dated Mar. 21, 2019.

International Search Report and Written Opinion corresponding to International Application No. US/PCT2018/033299 dated Mar. 6, 2019.

Australian Examination Report corresponding to Australian Patent No. 2016365632, pp. 1-4, dated May 3, 2019.

International Preliminary Report on Patentability corresponding to International Application No. PCT/US2017/050520, pp. 1-10, dated Apr. 4, 2019.

Canadian Office Action and Search Report corresponding to Canadian Patent Application No. 3033652, pp. 1-5, dated Apr. 15, 2019.

Final Office Action for U.S. Appl. No. 15/612,326 dated Nov. 8, 2019.

Japanese Office Action for Application No. 2018-527930 dated Jul. 23, 2019.

Australian Examination Report for Application No. 2017345050 dated Jul. 20, 2019.

Australian Examination Report for Application No. 2017345049 dated Aug. 5, 2019.

Australian Examination Report for Application No. 2017358595 dated Aug. 6, 2019.

Ramzi, A, et al., "Niobium and Aluminum Josephson Junctions Fabricated with a Damascene CMP Process", Physics Procedia, vol. 36, pp. 211-216 (2012). DOI: 10.1016/j.phpro.2012-06-148.

International Preliminary Report on Patentability for Application No. PCT/US2018/031139 dated Nov. 28, 2019.

Australian Examination Report for Application No. 2017360504 dated Dec. 20, 2019.

Australian Examination Report for Application No. 2017345049 dated Dec. 19, 2019.

Korean Office Action for Application No. 10-2018-7016289 dated Nov. 12, 2019.

* cited by examiner

METHOD OF MAKING A SUPERCONDUCTOR DEVICE

This invention was made with Government support under Contract No. 30069413. The Government has certain rights in this invention.

TECHNICAL FIELD

The present invention relates generally to superconductors, and more particularly to a method of making a superconductor device.

BACKGROUND

Superconducting circuits are one of the leading technologies proposed for quantum computing and cryptography applications that are expected to provide significant enhancements to national security applications where communication signal integrity or computing power are needed. They are operated at temperatures <100 kelvin. Efforts on fabrication of superconducting devices have mostly been confined to university or government research labs, with little published on the mass producing of superconducting devices. Therefore, many of the methods used to fabricate superconducting devices in these laboratories utilize processes or equipment incapable of rapid, consistent fabrication. Furthermore, the need for low temperature processing currently presents one of the more significant barriers to mass production of superconducting devices.

One of the common devices employed in superconducting circuits is a Josephson junction (JJ). Today's typical Josephson junctions (JJs) are formed using a self-aligned anodization process which uses a highly corrosive electrochemical bath to form a protective thick passivation layer around the JJ in the form of a large ring. This thick ring of oxidized superconducting material forms the insulation between the active part of the JJ and the top electrode wiring. Furthermore, the use of legacy processing techniques to form a JJ result in large topography problems and therefore problems with yield and reliability of the JJ. The use of anodization process results in a relatively large JJ area due to the need to mask and etch off the blanket anodization layer away from the JJ ring. Both of these processes lead to a minimum size of JJ of the order of 1 um diameter which limits the density and functionality of an integrated chip.

SUMMARY

In one example, a method of forming a superconductor device structure is provided. The method comprises forming a first dielectric layer overlying a substrate, forming a base electrode in the first dielectric layer with the base electrode having a top surface aligned with the top surface of the first dielectric layer, and forming a junction material stack over the base electrode. The method further comprises forming a hardmask over the junction material stack, etching away a portion of the junction material stack to form a Josephson junction (JJ) over the base electrode, and depositing a second dielectric layer over the hardmask, the JJ, the base electrode and the first dielectric layer. The method additionally comprises forming a first contact through the second dielectric layer to the base electrode to electrically couple the first contact to a first end of the JJ, and forming a second contact through the second dielectric layer and the hardmask to electrically coupled the second contact to a second end of the JJ.

In another example, a method of forming a superconductor device structure is provided. The method comprises forming a first dielectric layer overlying a substrate, forming a niobium base electrode in the first dielectric layer, the niobium base electrode having a top surface aligned with the top surface of the first dielectric layer, and depositing an aluminum layer over the base electrode and the first dielectric layer, and oxidizing the aluminum layer to form an aluminum oxide layer on the top surface of the aluminum layer. The method comprises forming a niobium layer over the aluminum oxide layer, forming a dielectric hardmask layer over the niobium layer, etching the dielectric hardmask layer to remove the dielectric hardmask layer everywhere except over dimensions that define a Josephson junction to form a hardmask, depositing a second dielectric layer over the JJ, the base electrode and the hardmask, and forming a passivation layer over the JJ, the base electrode and the hardmask to protect sides of the JJ and the base electrode from oxidation. The method also comprises forming a first contact through the second dielectric layer to the base electrode to electrically couple the first contact to a first end of the JJ, and forming a second contact through the second dielectric layer and the hardmask to electrically coupled the second contact to a second end of the JJ, and forming a first conductive line overlying the first contact and second conductive line overlying the second contact, wherein the first and second conductive lines have a top surface that is aligned with a top surface of the second dielectric layer.

In yet another method of forming a superconductor device interconnect structure. The method comprises forming a first dielectric layer overlying a substrate, forming a niobium base electrode in the first dielectric layer, the niobium base electrode having a top surface aligned with the top surface of the first dielectric layer, depositing an aluminum layer over the base electrode and the first dielectric layer, oxidizing the aluminum layer to form an aluminum oxide layer on the top surface of the aluminum layer, forming a niobium layer over the aluminum oxide layer, forming a diffusion barrier layer over the niobium layer, and forming a dielectric hardmask layer over the diffusion barrier layer. The method also comprises depositing and patterning a photoresist material layer over the dielectric hardmask layer to define dimensions of the Josephson junction, partially etching the dielectric hardmask layer, removing the photoresist material layer, completely etching the dielectric hardmask layer to remove the dielectric hardmask layer everywhere except over the dimensions defined by the Josephson junction to form the hardmask, forming a passivation layer over the JJ, the base electrode and the hardmask to protect sides of the JJ and the base electrode from oxidation, and depositing a second dielectric layer over the passivation layer. The method also comprises forming a first contact through the second dielectric layer to the base electrode to electrically couple the first contact to a first end of the JJ, and forming a second contact through the second dielectric layer and the hardmask to electrically couple the second contact to a second end of the JJ, and forming a first conductive line overlying the first contact and second conductive line overlying the second contact, wherein the first and second conductive lines have a top surface that is aligned with a top surface of the second dielectric layer.

DETAILED DESCRIPTION

The present invention is directed to a method of forming a superconductor device (e.g., Josephson junction (JJ)) interconnect structure. The method incorporates a scalable JJ process into a planarized superconducting interconnect and dielectric. Specifically, the method integrates a niobium based superconducting JJ (e.g., Nb/Al/AlOx/Nb) into a dual damascene process for scaling into a high density multilevel interconnect submicron technology using a hardmask etch process and in-situ sidewall passivation for improving yield and uniformity to support scaling fabrication into very large scale (VLS) superconducting electronics devices.

The method employs a dual damascene formation of a superconducting material as a base electrode coupled to a first end of a JJ along with a counter-electrode that extends to a dielectric surface, and thereby lends itself into a multi-layer interconnect scheme for high density wiring. Also the active junction area is formed on top of an underlying superconducting trace and requires no extra insulating layer. A top electrode is connected to a second end of the JJ using a via (contact) which is smaller than the junction diameter and therefore increases JJ density.

JJ's have been formed using a self-aligned anodization process which uses a highly corrosive electrochemical bath to form a protective thick passivation layer around the JJ in the form of a large ring. This thick ring of oxidized superconducting material forms the insulation between the active part of the JJ and the top electrode wiring. This anodization process was established because the junction region could be vulnerable to chemical/plasma and/or other damage from subsequent processing steps. The use of legacy processing techniques to form a JJ requires the use of aggressive chemistries to remove veil material following the junction etch process. In turn, this also requires the junction to be protected using an anodization process prior to exposing the junction to the chemicals and/or plasmas associated with this cleaning. The currently disclosed process eliminates the need for aggressive chemical and/or plasma cleaning through the use of a hardmask process. In addition, the current disclosure eliminates the need for anodization by using an in-situ (no vacuum break) passivation that prevents exposure of the junction perimeter to any subsequent processing environments.

The methodology accomplishes this by incorporating a hardmask process to eliminate exposure of the Josephson junction to resist strip processes and chemicals following junction definition. Additionally, a plasma passivation is incorporated of the junction material stack immediately following the junction etch process without exposure to the ambient environment. Furthermore, diffusion barriers are incorporated within the junction electrodes to prevent migration of oxygen within the junction metallization.

Figure 1:
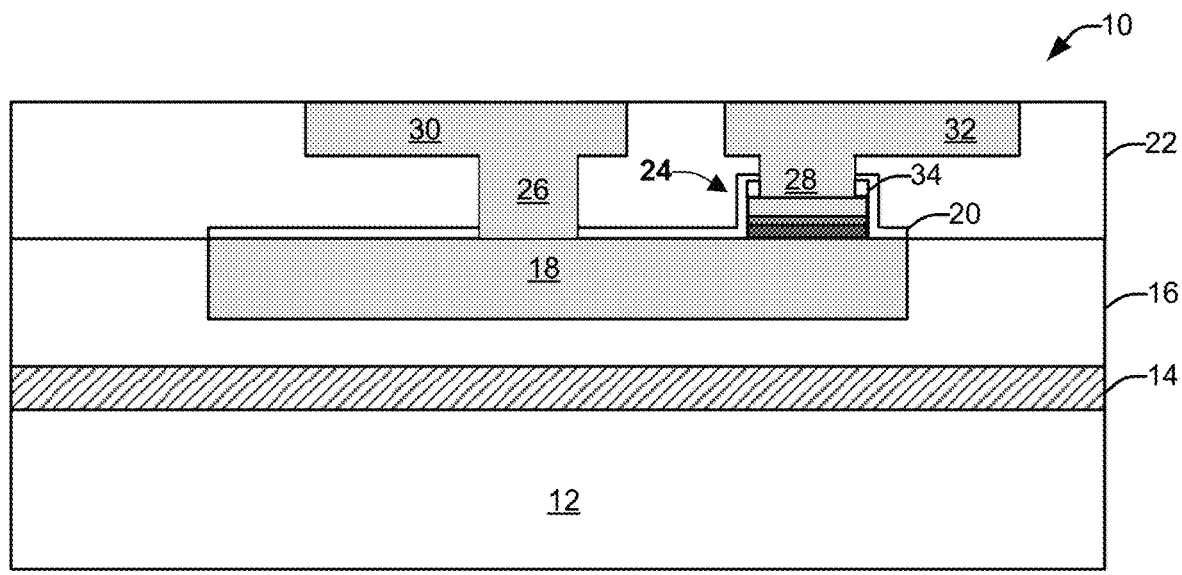
FIG. 1 illustrates cross-sectional view of a superconducting device interconnect structure.

FIG. 1 illustrates cross-sectional view of a superconducting device JJ interconnect structure 10. The superconducting device structure 10 includes an active layer 14 overlying a substrate 12. The substrate 12 can be formed of silicon, glass or other substrate material. The active layer 14 can be a ground layer or a device layer. A first dielectric layer 16 overlies the active layer 14, and a second dielectric layer 22 overlies the first dielectric layer 16. Both the first and the second dielectric layers are formed of a low temperature dielectric material that can be employed in low temperatures (e.g., less than or equal to 160 degrees Celsius) typically utilized in the formation of JJs.

A base electrode 18 is embedded in the first dielectric layer 16. A JJ 24 is disposed over the base electrode 18 near a first end of the base electrode 18 and is embedded in the second dielectric layer 22. A thin aluminum layer with an oxidized top surface and capped with a niobium layer forms a junction material stack along with the base electrode 18 to form the JJ 24. A first conductive contact 26 extends from the base electrode 18 at a second end to a counter electrode that is formed from a first conductive line 30, such that the counter electrode is electrically coupled to a first end of the JJ 24. A second conductive contact 28 extends from a second end of the JJ 24 to a top electrode formed from a second conductive line 32. The second conductive contact 28 is smaller than the junction diameter and therefore increases JJ density. Each of the contacts and conductive lines are formed of a superconducting material, such as niobium. A passivation layer 20 is disposed in between the first dielectric layer 16 and the second dielectric layer 22 to cover portions of the base electrode and sides of the JJ 24 from oxidation during processing. Remaining portion of a hardmask 34 are shown that reside after formation of the superconducting device JJ interconnect structure 10. The hardmask protects the JJ 24 against damage that would occur utilizing photoresist processes to form the JJ 24 and will be explained during the discussion of FIGS. 2-19.

Turning now to FIGS. 2-19, fabrication is discussed in connection with formation of interconnects in the superconducting device of FIG. 1. It is to be appreciated that the present example is discussed with respect to a process flow that starts with the formation of either a single or dual damascene layer of superconducting metal in an insulating dielectric. If the JJ is formed first then it would be a single damascene as depicted below or dual damascene if inserted within a multi-level interconnect. The present example will be illustrated with respect to a single damascene trench etched into a dielectric thin film to form a bottom electrode followed by a dual damascene process to form a top electrode.

Figure 2:
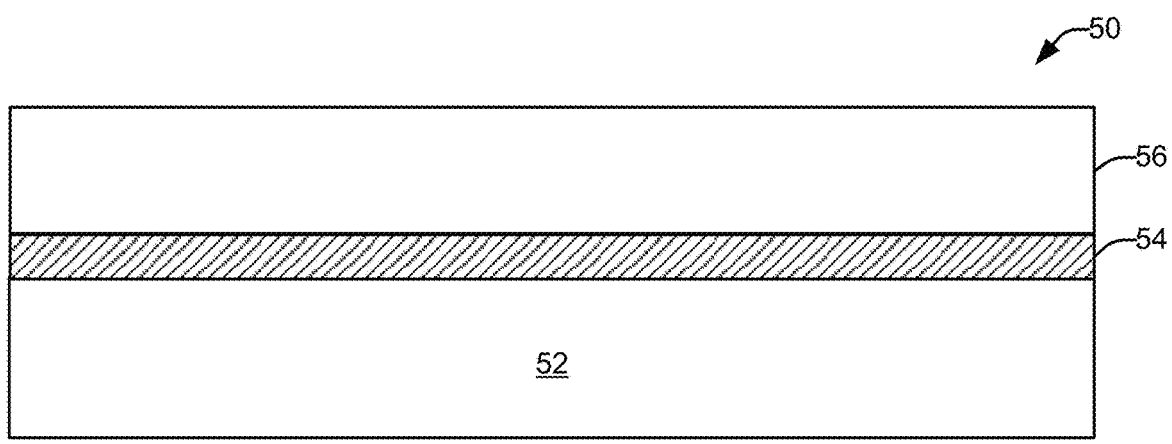
FIG. 2 illustrates a schematic cross-sectional view of an example of a superconductor structure in its early stages of fabrication.

FIG. 2 illustrates a superconductor structure 50 in its early stages of fabrication. The superconductor structure 50 includes an active layer 54, such as a ground layer or device layer, that overlays an underlying substrate 52. The underlying substrate 52 can be, for example, a silicon or glass wafer that provides mechanical support for the active layer 54 and subsequent overlying layers. A first dielectric layer 56 is formed over the active layer 54. Any suitable technique for forming the first dielectric layer 56 may be employed such as Low Pressure Chemical Vapor Deposition (LP-CVD), Plasma Enhanced Chemical Vapor Deposition (PECVD), High Density Chemical Plasma Vapor Deposition (HDPCVD), sputtering or spin on techniques to a thickness suitable for providing an interconnect layer. Alternatively, the first dielectric layer 56 can be formed directly on the substrate 50.

Figure 3:
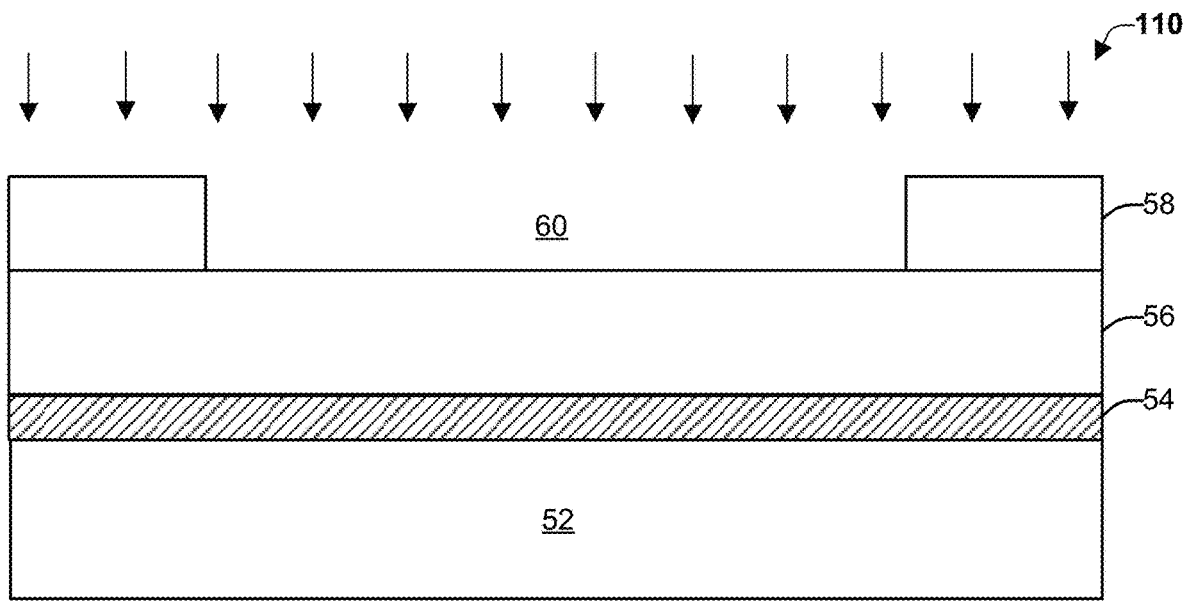
FIG. 3 illustrates a schematic cross-sectional view of the structure of FIG. 2 after a photoresist material layer has been deposited and patterned, and while undergoing an etch process.
Figure 4:
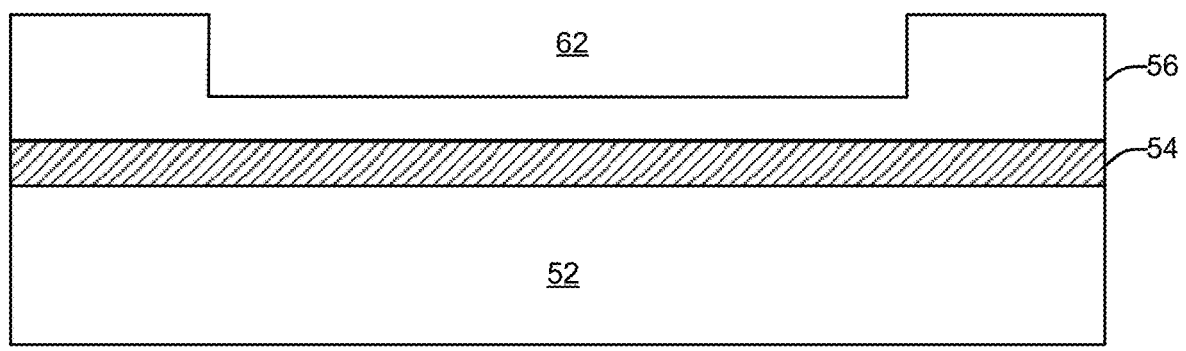
FIG. 4 illustrates a schematic cross-sectional view of the structure of FIG. 3 after the etch process and after the photoresist material layer has been stripped.

Next, as illustrated in FIG. 3, a photoresist material layer 58 is applied to cover the structure and is then patterned and developed to expose a trench opening 60 in the photoresist material layer 58 in accordance with a trench pattern. The photoresist material layer 58 can have a thickness that varies in correspondence with the wavelength of radiation used to pattern the photoresist material layer 58. The photoresist material layer 58 may be formed over the dielectric layer 56 via spin-coating or spin casting deposition techniques, selectively irradiated (e.g., via deep ultraviolet (DUV) irradiation) and developed to form the trench opening 60.

FIG. 3 also illustrates performing of an etch 110 (e.g., anisotropic reactive ion etching (RIE)) on the dielectric layer 56 to form an extended trench openings 62 (FIG. 4) in the dielectric layer 56 based on the trench pattern in the photoresist material layer 58. The etch step 110 can be a dry etch and employ an etchant which selectively etches the underlying dielectric layer 56 at a faster rate than the underlying active layer 54 and the overlying photoresist material layer 58. For example, the first dielectric layer 56 may be anisotropically etched with a plasma gas(es), herein carbon tetrafloride ($CF_4$) containing fluorine ions, in a commercially available etcher, such as a parallel plate RIE apparatus or, alternatively, an electron cyclotron resonance (ECR) plasma reactor to replicate the mask pattern of the patterned of the photoresist material layer 58 to thereby create the extended trench opening 62. The photoresist material layer 58 is thereafter stripped (e.g., ashing in an $O_2$ plasma) so as to result in the structure shown in FIG. 4.

Figure 5:
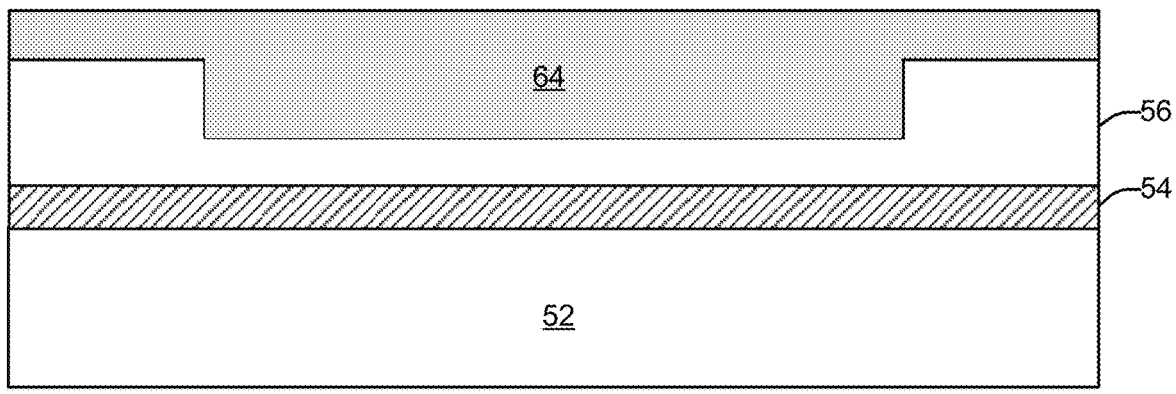
FIG. 5 illustrates a schematic cross-sectional view of the structure of FIG. 4 after a contact material fill.

Next, the structure undergoes a contact material fill to deposit a superconducting material 64, such as niobium, into the trench 62 to form the resultant structure of FIG. 5. The contact material fill can be deposited employing a standard contact material deposition. Following deposition of the contact material fill, the superconducting material 64 is polished via chemical mechanical polishing (CMP) down to the surface level of the dielectric layer 56 to form a base electrode 66 and provide the resultant structure of FIG. 6.

Figure 6:
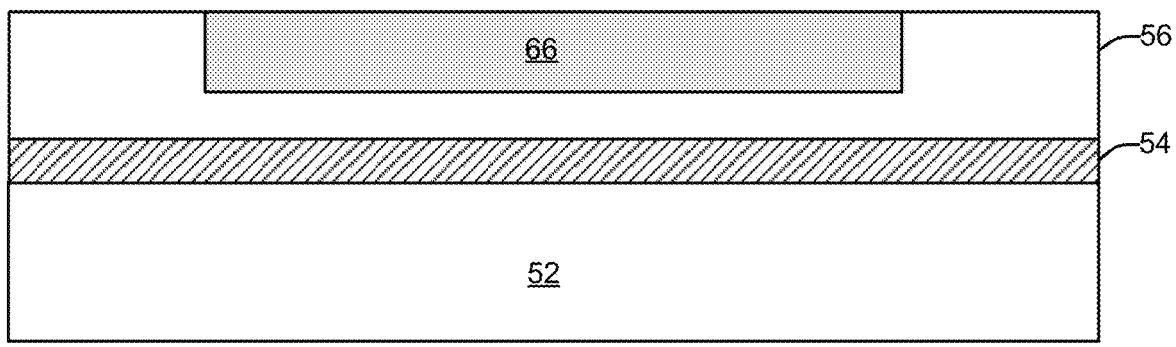
FIG. 6 illustrates a schematic cross-sectional view of the structure of FIG. 5 after undergoing a chemical mechanical polish.
Figure 7:
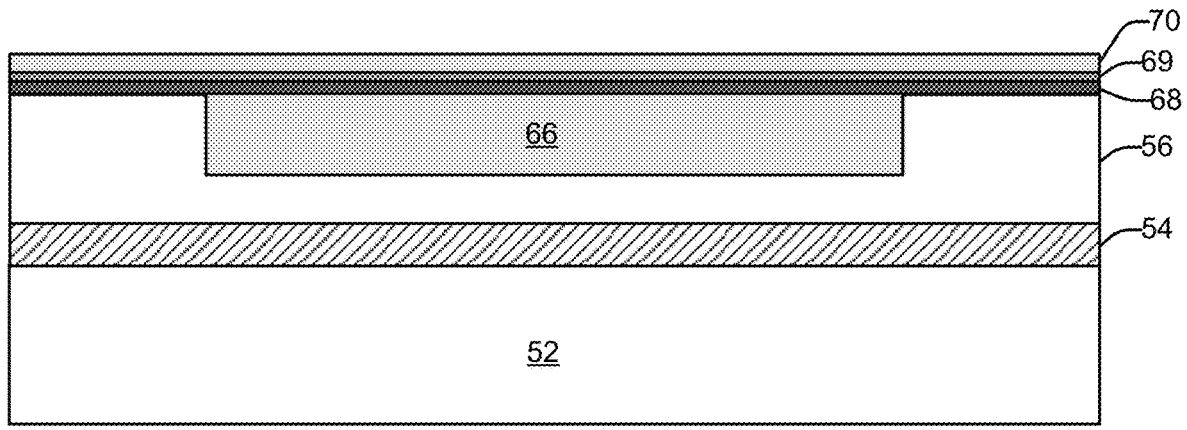
FIG. 7 illustrates a schematic cross-sectional view of the structure of FIG. 6 after undergoing formation of a junction material stack.

Next junction materials are deposited over the polished surface of the structure of FIG. 6. In the example of FIG. 7, a thin aluminum layer 68 is deposited, oxidized to form an oxidized top surface 69 and capped with a niobium layer 70 to form a junction material stack. The thin oxidized aluminum 69 forms the tunnel barrier and the niobium 70 sets the gap voltage of the JJ.

Figure 8:
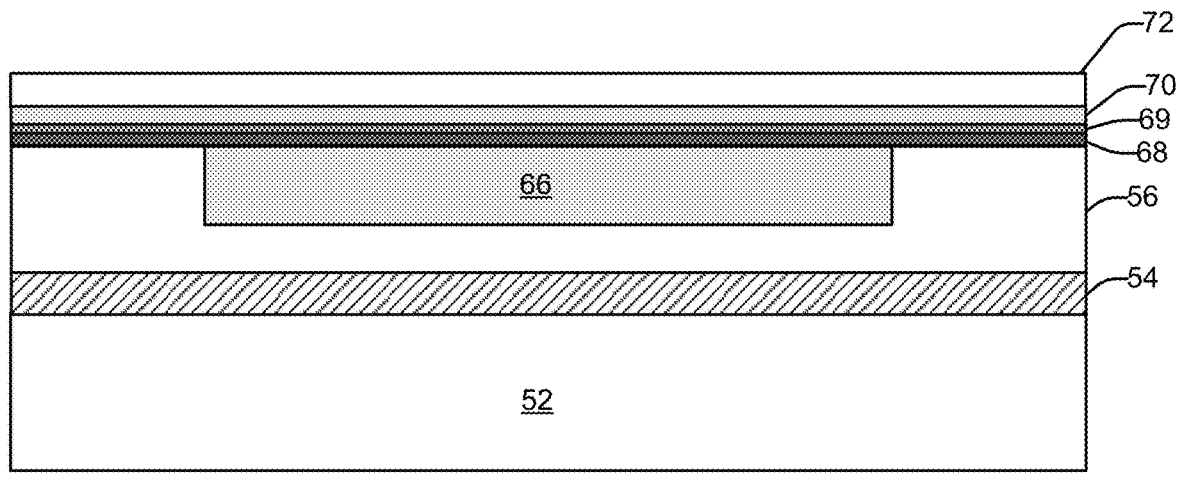
FIG. 8 illustrates a schematic cross-sectional view of the structure of FIG. 7 after undergoing formation of dielectric hardmask layer.
Figure 9:
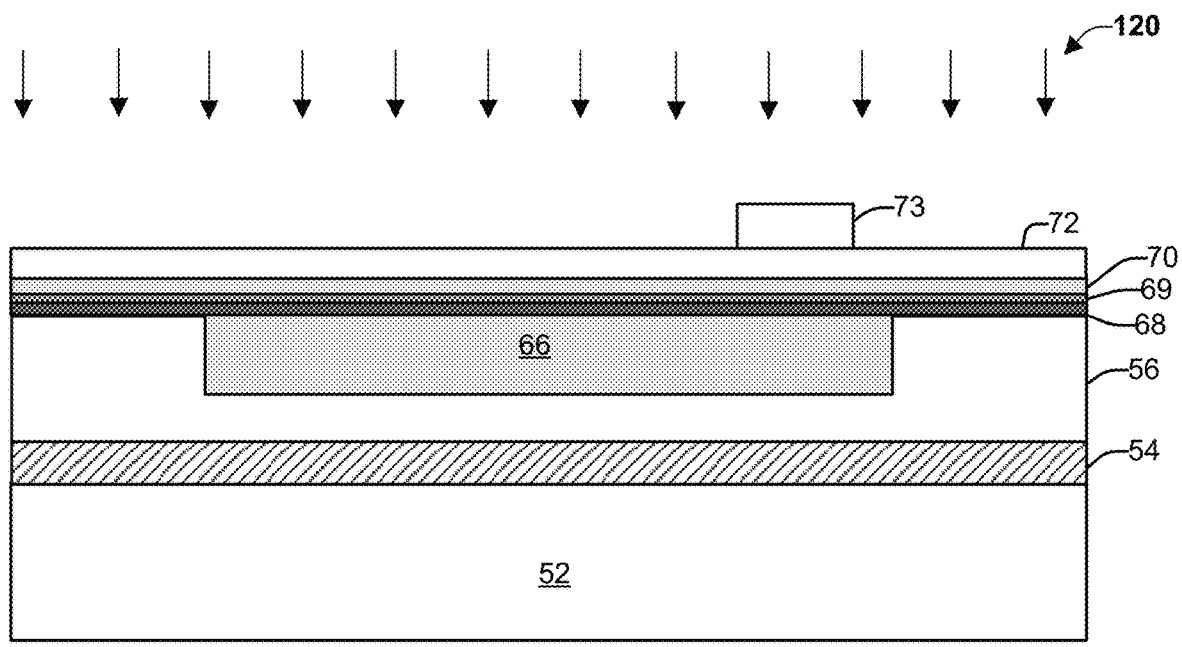
FIG. 9 illustrates a schematic cross-sectional view of the structure of FIG. 8 after a photoresist material layer has been deposited and patterned, and while undergoing a partial etch process.

Following formation of the niobium layer 70, the junctions stack is capped with a thin dielectric layer 72, as shown in FIG. 8, which will eventually form a JJ hardmask used in the junction etch process. The JJ hardmask is defined using Deep Ultraviolet (DUV) photolithography patterning over the dielectric hardmask cap layer 72. As illustrated in FIG. 9, a photoresist material layer 73 is applied to cover a portion of the structure and is then patterned and developed to expose the junction material stack, the diffusion barrier 71 and the dielectric layer 72 everywhere except where the JJ is going to be formed.

Figure 10:
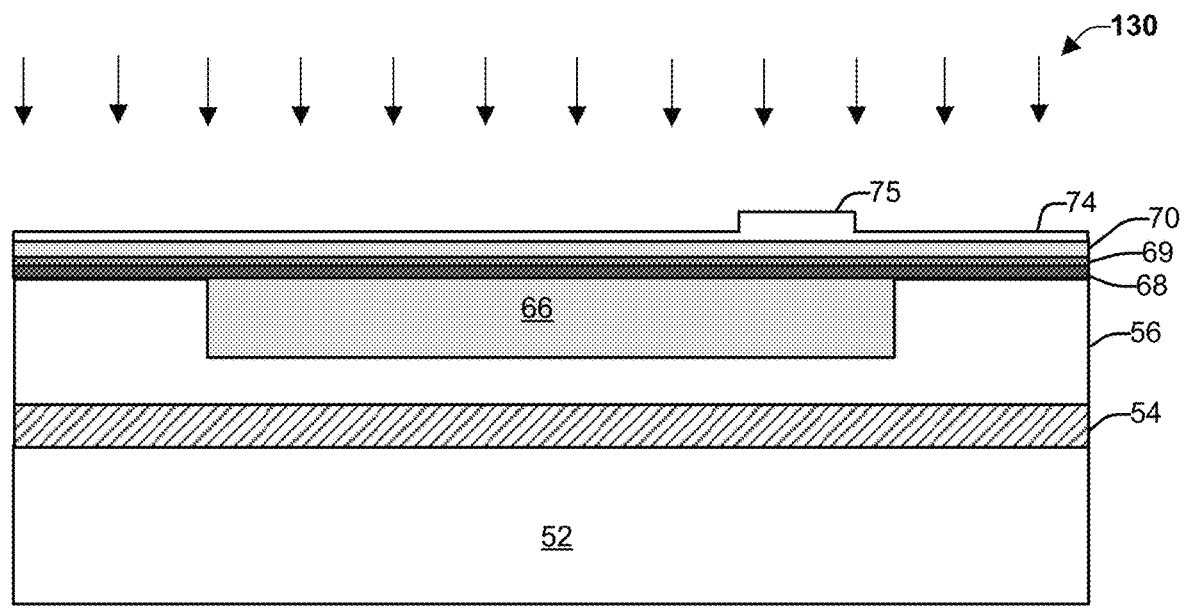
FIG. 10 illustrates a schematic cross-sectional view of the structure of FIG. 9 after the partial etch process of the dielectric hardmask layer and after the photoresist material layer has been stripped, and while undergoing a complete etch process of the dielectric hardmask layer.

As shown in FIG. 9, a Reactive Ion Etch (RIE) 120 is performed to define the final size of the dielectric hardmask. Importantly, as shown in FIG. 9, the hardmask etch is a partial etch 120 which does not completely clear the dielectric layer in the field area of the pattern leaving a protective barrier 74 with a Junction defining portion 75, as shown in FIG. 10. The underlying niobium layer 70 is not exposed during this partial etch process which eliminates the creation of veil residue around the perimeter junction features. Niobium based veil residue is typically very difficult to remove and may impact the overall yield and uniformity of the junction fabrication. Following the partial hardmask etch 120, the resist mask 73 is removed using a combination of wet processes (posistrip, dilute sulfuric peroxide for example) and/or plasma processes (oxygen plasma for example) to provide the resultant structure of FIG. 10. It is noteworthy that the partial hardmask etch 120 leaves the protective barrier 74 above the junction metallization which allows the use of more aggressive resist strip processes without damage to the junction materials. This will likely improve the overall yield of the junction fabrication.

Figure 11:
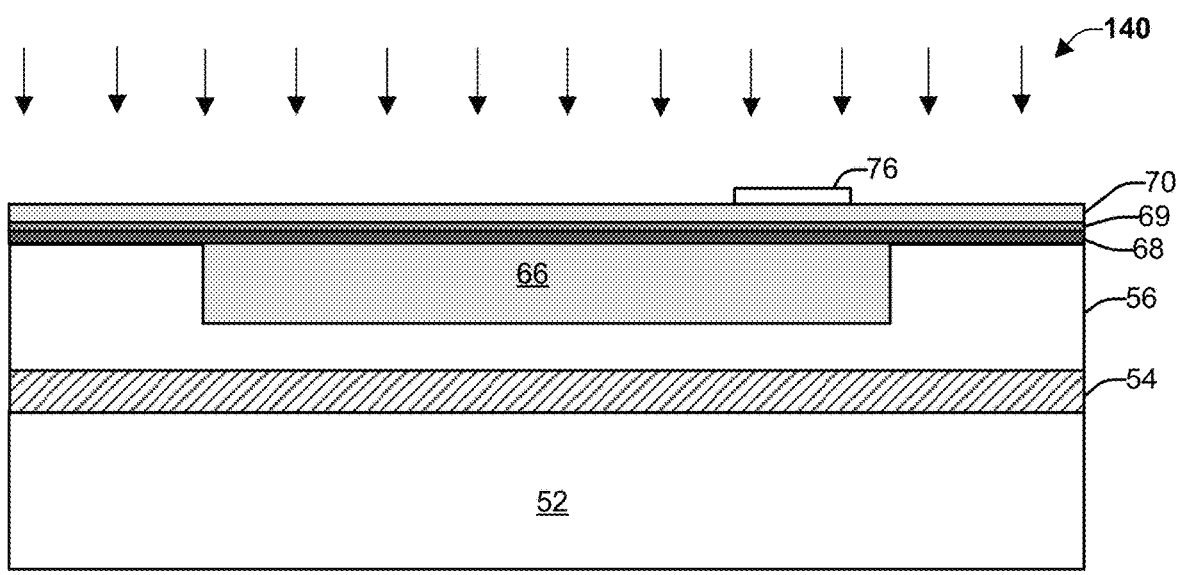
FIG. 11 illustrates a schematic cross-sectional view of the structure of FIG. 10 undergoing an etch process of the junction material stack.

Further illustrated in FIG. 10, a further Reactive Ion Etching (RIE) 130 is used to complete the hardmask etch to provide the resultant structure in FIG. 11. The RIE 130 clears the protective barrier 74 which remains from the partial hardmask 74 and exposes the junction metallization (Niobium for example) leaving only a hardmask 76 where the Junction defining portion 75 resided. Importantly, this process is completed without a resist mask in place which eliminates the veil material discussed earlier.

FIG. 11 also illustrates performing of an etch 140 (e.g., anisotropic (RIE)) on the junction material stack material to form a JJ 78 (FIG. 12) overlying the base electrode 66 to define the final JJ size. The etch step 140 can be a dry etch that employs an etchant which selectively etches the junction material stack layer at a faster rate than the underlying base electrode 66 and the overlying hardmask 76. A chlorine based plasma etch is utilized as the etchant since it will etch superconducting materials, such as niobium and aluminum. The aluminum oxide is so thin that etching does not stop due to the presence of argon in the etching chemistry. The plasma etch is desired to not over-etch significantly into the underlying base electrode 66, which is benefited by the good planarity of the underlying structure to thereby create the JJ 78.

Figure 12:
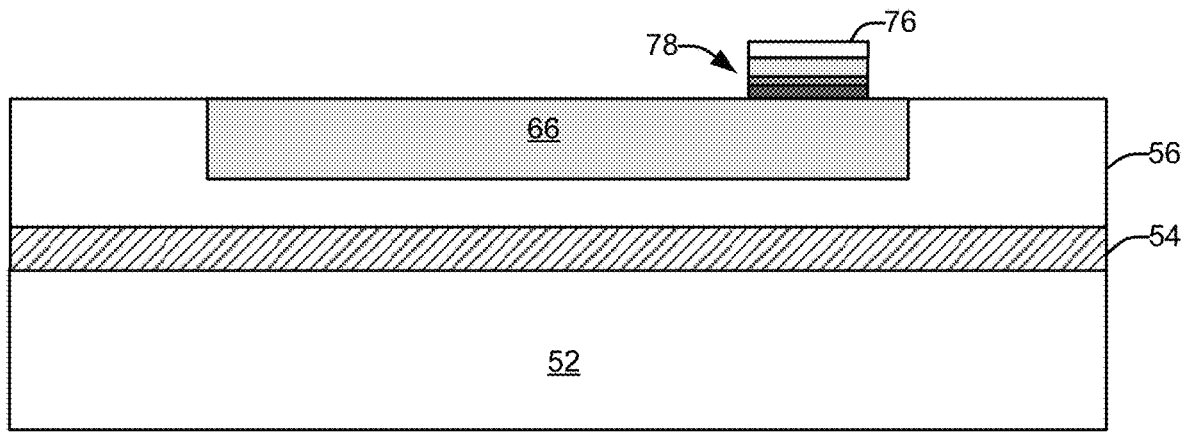
FIG. 12 illustrates a schematic cross-sectional view of the structure of FIG. 11 after undergoing the etch process of the junction material stack.
Figure 13:
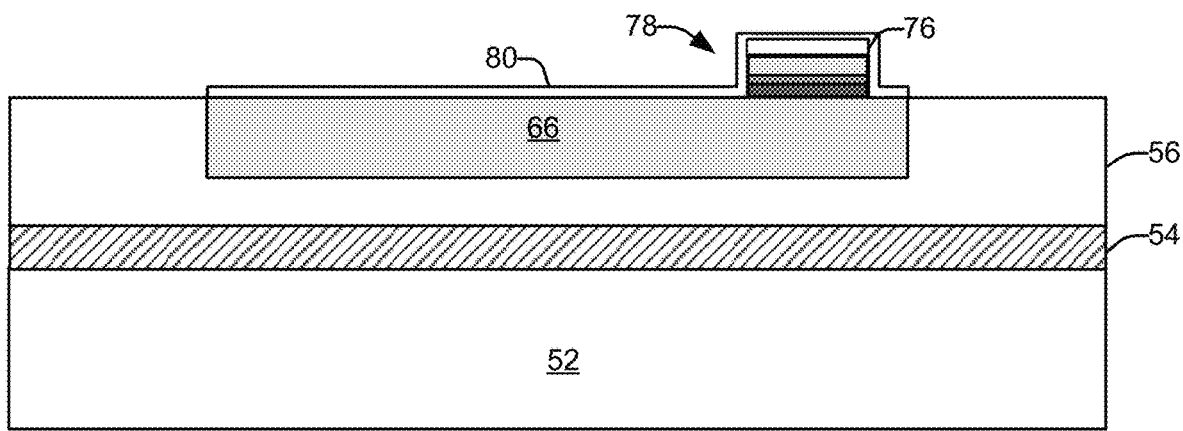
FIG. 13 illustrates a schematic cross-sectional view of the structure of FIG. 12 after formation of a passivation layer.

Next, a passiviation layer 80 is formed over the structure of FIG. 12 to provide the resultant structure of FIG. 13. This process produces a protective barrier on the sidewall of the junction metallization immediately following the etch process. This process uses a plasma. Importantly, this passivation process is completed using a plasma to produce a nitride and/or oxide barrier on the junction without breaking vacuum following the junction etch process. This in-situ passivation is enabled by the use of a hardmask for the junction etch which does not require a resist strip following the metal etch. This passivation layer 80 also produces a diffusion barrier on top surface of the base electrode 66.

Figure 14:
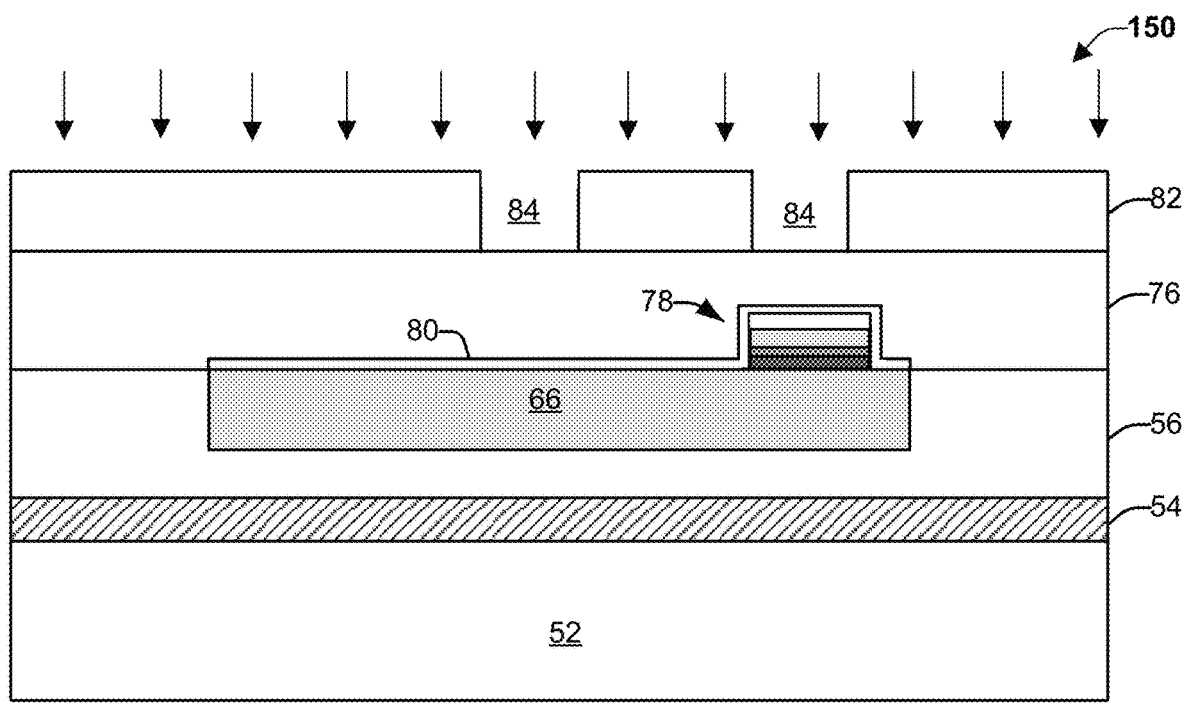
FIG. 14 illustrates a schematic cross-sectional view of the structure of FIG. 13 after undergoing deposition of a second dielectric layer, after a photoresist material layer has been deposited and patterned, and while undergoing an etch process.
Figure 15:
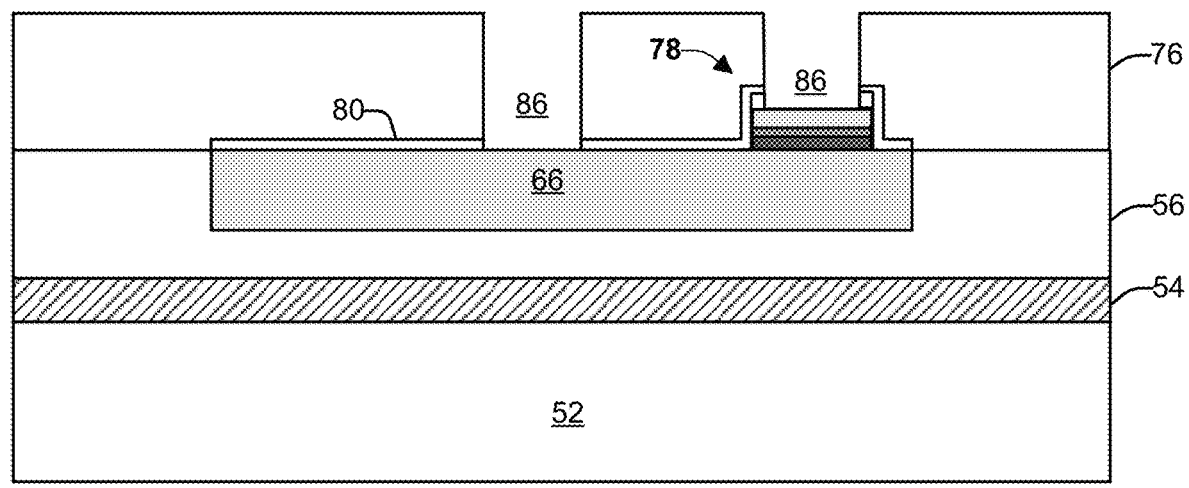
FIG. 15 illustrates a schematic cross-sectional view of the structure of FIG. 14 after the etch process and after the photoresist material layer has been stripped.

Next, as represented in FIG. 14, a second dielectric layer 76 is formed over the structure of FIG. 13 to encapsulate the JJ 78. A photoresist material layer 82 is applied to cover the structure and is then patterned (e.g., DUV imaged) and developed to expose open regions 84 in the photoresist material layer 82 in accordance with a via pattern. FIG. 14 also illustrates performing of an etch 150 on the second dielectric layer 76 to form extended via openings 86 (FIG. 15) in the second dielectric layer 76 based on the via pattern in the photoresist material layer 82. The etch 150 also etches through the remaining hardmask 76 and passivation layer 80 to provide a first extended open region that extends to the base electrode 66 and a second extended open region that extends to the JJ 78 to provide connections to the base electrode 66 and the JJ 78. The photoresist material layer 82 is thereafter stripped (e.g., ashing in an O₂ plasma) so as to result in the structure shown in FIG. 15.

Figure 16:
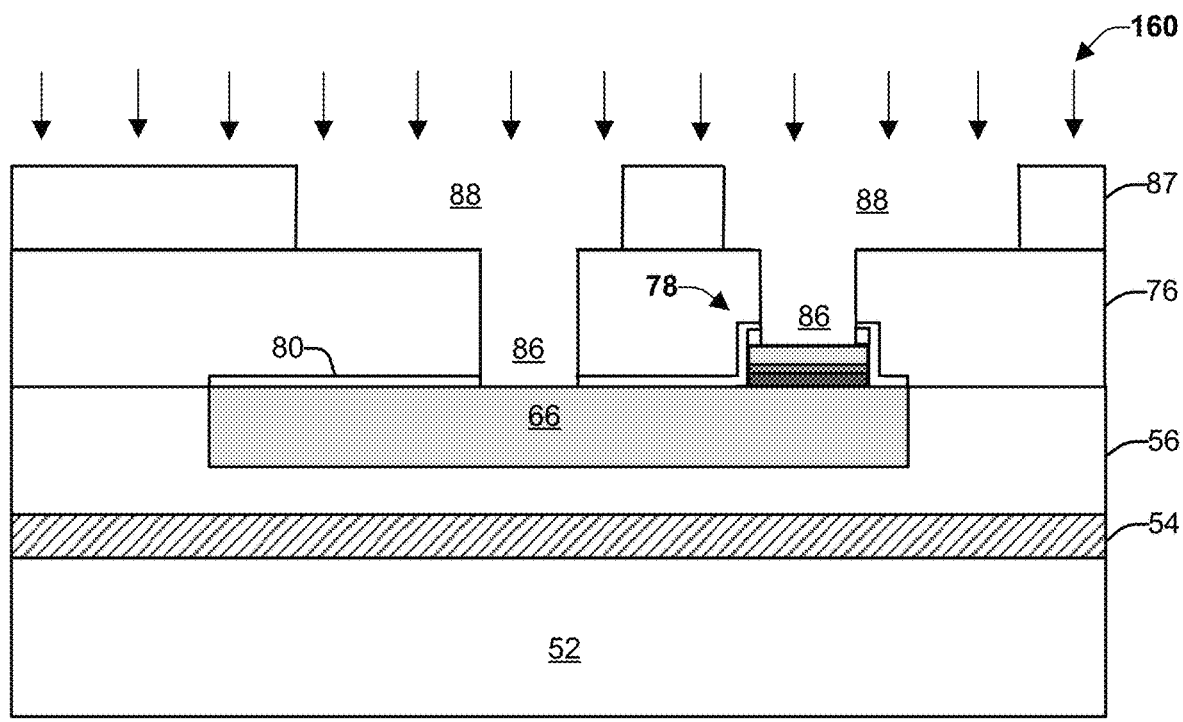
FIG. 16 illustrates a schematic cross-sectional view of the structure of FIG. 15 after a photoresist material layer has been deposited and patterned, and while undergoing an etch process.
Figure 17:
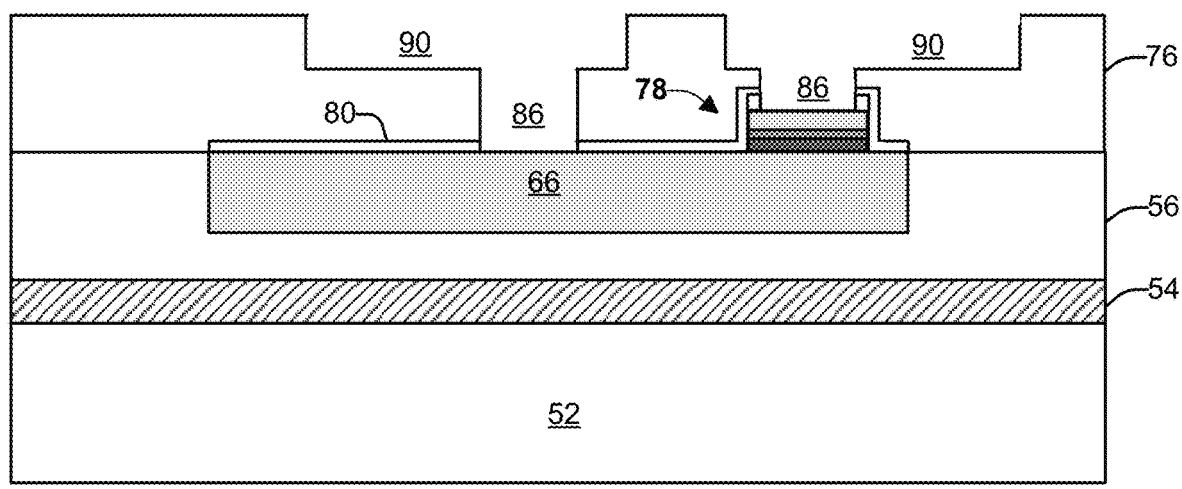
FIG. 17 illustrates a schematic cross-sectional view of the structure of FIG. 16 after the etch process and after the photoresist material layer has been stripped.

Next, as represented in FIG. 16, a photoresist material layer 87 is applied to cover the structure and is then patterned and developed to expose open trench regions 88 in the photoresist material layer 87 in accordance with a trench pattern. FIG. 16 also illustrates performing of an etch 160 (e.g., anisotropic reactive ion etching (RIE)) on the second dielectric layer 76 to form extended openings 90 (FIG. 17) in the second dielectric layer 76 based on the trench pattern in the photoresist material layer 87. The photoresist material layer 87 is thereafter stripped (e.g., ashing in an O₂ plasma) so as to result in the structure shown in FIG. 17.

Figure 18:
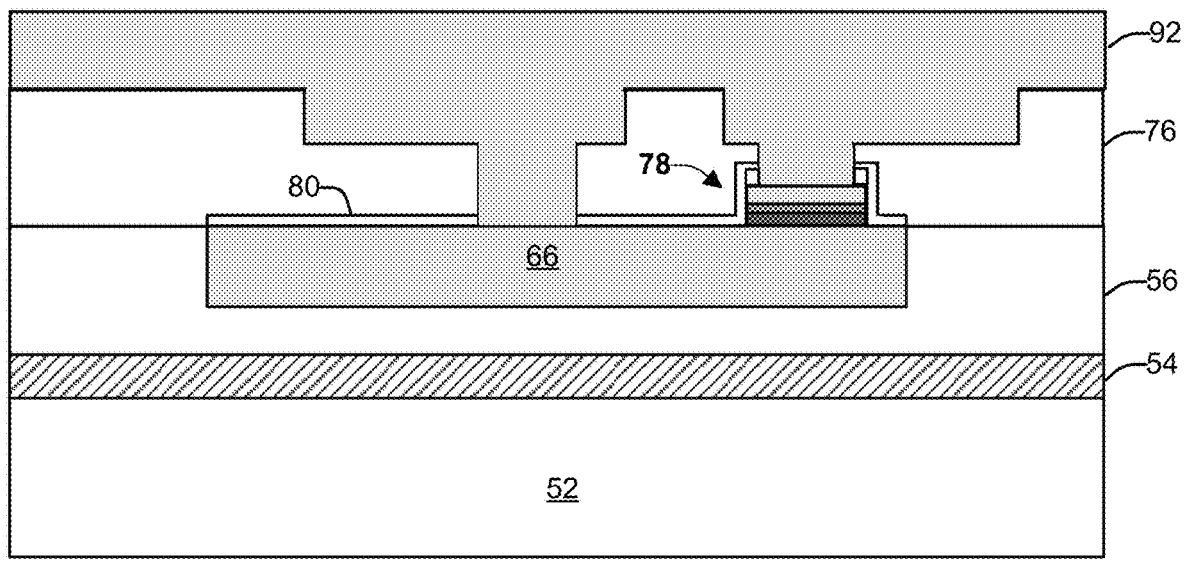
FIG. 18 illustrates a schematic cross-sectional view of the structure of FIG. 17 after a contact material fill.
Figure 19:
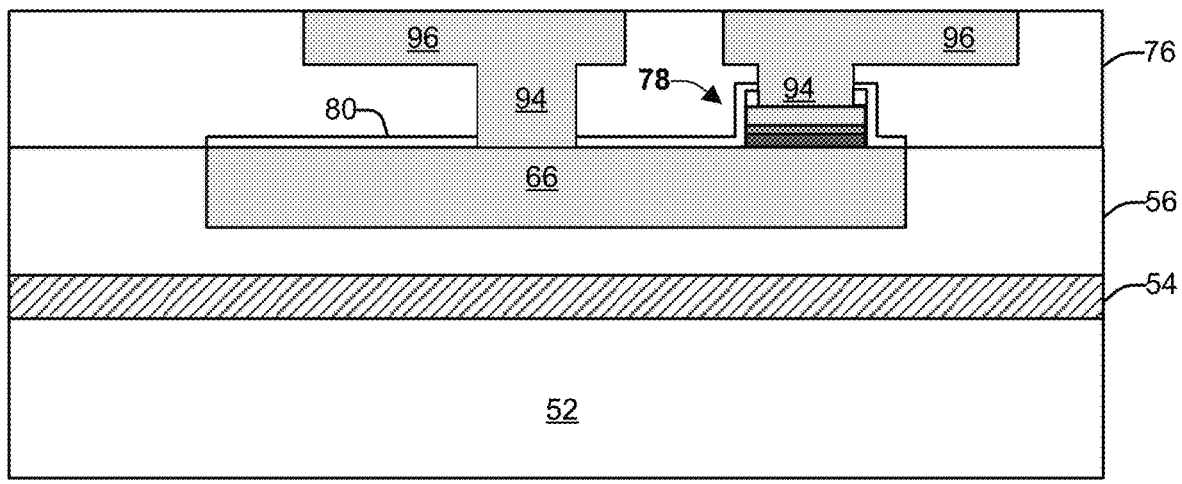
FIG. 19 illustrates a schematic cross-sectional view of the structure of FIG. 18 after undergoing a chemical mechanical polish.

Next, the structure undergoes a contact material fill to deposit superconducting material 92, such as niobium, into the vias 86 and trenches 90 employing a standard contact material deposition to provide the resultant structure in FIG. 18. Following deposition of the contact material fill, the contact material is polished via chemical mechanical polishing (CMP) down to the surface level of the second non-oxide base dielectric layer 76 to provide the resultant structure in FIG. 19. A resultant final structure is provided that includes contacts 94 that extend to the base electrode 66 and the JJ 78 coupled to respective conductive lines 96 to provide a structure similar to the structure illustrated in FIG. 1. The conductive lines 96 form a counter electrode coupled to the base electrode 66 which is coupled to a first end of the JJ 78 with a top electrode coupled to a second end of the JJ 78.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims.

What is claimed is:

1. A method of forming a superconductor device structure, the method comprising:
    forming a first dielectric layer overlying a substrate;
    forming a base electrode in the first dielectric layer, the base electrode having a top surface aligned with the top surface of the first dielectric layer;
    forming a junction material stack over the base electrode;
    forming a hardmask over the junction material stack where a Junction defining portion resides;
    etching away a portion of the junction material stack that does not include where the Junction defining portion resides to form a Josephson junction (JJ) over the base electrode;
    depositing a second dielectric layer over the hardmask, the JJ, the base electrode and the first dielectric layer; and
    forming a first contact through the second dielectric layer to the base electrode to electrically couple the first contact to a first end of the JJ; and
    forming a second contact through the second dielectric layer and the hardmask to electrically coupled the second contact to a second end of the JJ.

2. The method of claim 1, wherein the JJ is formed from an Aluminum/Aluminum oxide layer disposed between the base electrode and a niobium layer.

3. The method of claim 2, wherein the base electrode is formed from niobium.

4. The method of claim 1, wherein the second contact has a diameter that is smaller than the diameter of the JJ.

5. The method of claim 1, wherein the dielectric material employed in the first dielectric layer and the second dielectric layer is a material that can form the dielectric first and second material layers at a temperature of about 160° Celsius.

6. The method of claim 1, further comprising forming a first conductive line overlying the first contact and second conductive line overlying the second contact, wherein the first and second conductive lines have a top surface that is aligned with a top surface of the second dielectric layer.

7. The method of claim 6, wherein the first and second contacts and the first and second conductive lines are formed by a dual damascene process.

8. The method of claim 1, wherein the base electrode is formed by a single damascene process.

9. The method of claim 1, wherein forming a junction material stack over the base electrode comprises:
    depositing an aluminum layer over the base electrode and the first dielectric layer;
    oxidizing the aluminum layer to form an aluminum oxide layer on the top surface of the aluminum layer;
    forming a niobium layer over the aluminum oxide layer; and
    forming a diffusion barrier layer over the niobium layer, wherein forming a hardmask over the junction material stack where a Junction defining portion resides comprises:

forming a dielectric hardmask layer over the diffusion barrier layer;
depositing and patterning a photoresist material layer over the dielectric hardmask layer to define dimensions of the Josephson junction;
partially etching the dielectric hardmask layer;
removing the photoresist material layer; and
completely etching the dielectric hardmask layer to remove the dielectric hardmask layer everywhere except over the dimensions defined by the Josephson junction to form the hardmask, and
wherein etching away a portion of the junction material stack that does not include where the Junction defining portion resides to form a Josephson junction (JJ) over the base electrode comprises:
etching the niobium layer, the aluminum oxide layer and the aluminum layer to remove portions of the niobium layer, the aluminum oxide layer and the aluminum layer to form a JJ.

10. The method of claim 9, further comprising forming a passivation layer over the JJ and the base electrode prior to depositing a second dielectric layer.

11. A method of forming a superconductor device structure, the method comprising:
forming a first dielectric layer overlying a substrate;
forming a niobium base electrode in the first dielectric layer, the niobium base electrode having a top surface aligned with the top surface of the first dielectric layer;
depositing an aluminum layer over the base electrode and the first dielectric layer;
oxidizing the aluminum layer to form an aluminum oxide layer on the top surface of the aluminum layer;
forming a niobium layer over the aluminum oxide layer;
forming a dielectric hardmask layer over the niobium layer;
etching the dielectric hardmask layer to remove the dielectric hardmask layer everywhere except over dimensions that define a Josephson junction to form a hardmask;
depositing a second dielectric layer over the JJ, the base electrode and the hardmask;
forming a passivation layer over the JJ, the base electrode and the hardmask to protect sides of the JJ and the base electrode from oxidation;
forming a first contact through the second dielectric layer to the base electrode to electrically couple the first contact to a first end of the JJ, and forming a second contact through the second dielectric layer and the hardmask to electrically coupled the second contact to a second end of the JJ; and
forming a first conductive line overlying the first contact and second conductive line overlying the second contact, wherein the first and second conductive lines have a top surface that is aligned with a top surface of the second dielectric layer.

12. The method of claim 11, wherein the second contact has a diameter that is smaller than the diameter of the JJ.

13. The method of claim 11, wherein the dielectric material employed in the first dielectric layer and the second dielectric layer is a material that can form the dielectric first and second material layers at a temperature of about 160° Celsius.

14. The method of claim 11, wherein the first and second contacts and the first and second conductive lines are formed by a dual damascene process, and the base electrode is formed from a single damascene process.

15. The method of claim 11, further comprising:
depositing and patterning a photoresist material layer over the dielectric hardmask layer to define dimensions of the Josephson junction;
partially etching the dielectric hardmask layer;
removing the photoresist material layer; and
wherein the etching the dielectric mask layer comprises completely etching the dielectric layer to remove the dielectric mask layer everywhere except over the dimensions defined by the Josephson junction to form the hardmask.

16. The method of claim 11, further comprising forming a diffusion barrier layer over the niobium layer prior to forming a dielectric hardmask layer.

17. A method of forming a superconductor device interconnect structure, the method comprising:
forming a first dielectric layer overlying a substrate;
forming a niobium base electrode in the first dielectric layer, the niobium base electrode having a top surface aligned with the top surface of the first dielectric layer;
depositing an aluminum layer over the base electrode and the first dielectric layer;
oxidizing the aluminum layer to form an aluminum oxide layer on the top surface of the aluminum layer;
forming a niobium layer over the aluminum oxide layer;
forming a diffusion barrier layer over the niobium layer;
forming a dielectric hardmask layer over the diffusion barrier layer;
depositing and patterning a photoresist material layer over the dielectric hardmask layer to define dimensions of a Josephson junction;
partially etching the dielectric hardmask layer;
removing the photoresist material layer;
completely etching the dielectric hardmask layer to remove the dielectric hardmask layer everywhere except over the dimensions defined by the Josephson junction to form the hardmask;
forming a passivation layer over the JJ, the base electrode and the hardmask to protect sides of the JJ and the base electrode from oxidation;
depositing a second dielectric layer over the passivation layer;
forming a first contact through the second dielectric layer to the base electrode to electrically couple the first contact to a first end of the JJ, and forming a second contact through the second dielectric layer and the hardmask to a second end of the JJ; and
forming a first conductive line overlying the first contact and second conductive line overlying the second contact, wherein the first and second conductive lines have a top surface that is aligned with a top surface of the second dielectric layer.

18. The method of claim 17, wherein the second contact has a diameter that is smaller than the diameter of the JJ.

19. The method of claim 17, wherein the dielectric material employed in the first dielectric layer and the second dielectric layer is a material that can form the dielectric first and second material layers at a temperature of about 160° Celsius.

20. The method of claim 17, wherein the first and second contacts and the first and second conductive lines are formed by a dual damascene process, and the base electrode is formed from a single damascene process.

* * * * *